US012243255B2

(12) United States Patent
Otake et al.

(10) Patent No.: US 12,243,255 B2
(45) Date of Patent: Mar. 4, 2025

(54) MAGNETIC RESONANCE IMAGING DEVICE, ATTACHMENT POSITION OUTPUT METHOD, AND STORAGE MEDIUM

(71) Applicant: CANON MEDICAL SYSTEMS CORPORATION, Tochigi (JP)

(72) Inventors: Fumiyasu Otake, Sakura (JP); Sho Kawajiri, Nasushiobara (JP)

(73) Assignee: CANON MEDICAL SYSTEMS CORPORATION, Tochigi (JP)

(*) Notice: Subject to any disclaimer, the term of this patent is extended or adjusted under 35 U.S.C. 154(b) by 438 days.

(21) Appl. No.: 17/668,431

(22) Filed: Feb. 10, 2022

(65) Prior Publication Data
US 2022/0270283 A1 Aug. 25, 2022

(30) Foreign Application Priority Data

Feb. 16, 2021 (JP) ................. 2021-022262

(51) Int. Cl.
*G06T 7/70* (2017.01)
*G01R 33/54* (2006.01)
(Continued)

(52) U.S. Cl.
CPC .............. *G06T 7/70* (2017.01); *G01R 33/543* (2013.01); *G06V 10/764* (2022.01); *G06V 40/10* (2022.01); *G06T 2207/30196* (2013.01)

(58) Field of Classification Search
CPC . A61B 2576/00; A61B 1/00; A61B 2090/374; A61B 2090/3954;
(Continued)

(56) References Cited

U.S. PATENT DOCUMENTS 9,596,991 B2 * 3/2017 Choi ..................... G16H 50/20
2007/0238963 A1 * 10/2007 Kaminaga ............. A61B 6/545
600/407
(Continued)

FOREIGN PATENT DOCUMENTS

JP 2009-39519 A 2/2009
JP 2009-183689 A 8/2009
(Continued)

OTHER PUBLICATIONS

Office Action issued Oct. 23, 2024, in corresponding Japanese Patent Application No. 2021-022262, 7 pages.

*Primary Examiner* — Shaghayegh Azima
(74) *Attorney, Agent, or Firm* — Oblon, McClelland, Maier & Neustadt, L.L.P.

(57) ABSTRACT

A magnetic resonance imaging device according to an embodiment includes a processing circuitry. The processing circuitry obtains, from an image of a test subject taken by an optical photographing device, image-related information regarding at least either the test subject or a radio frequency (RF) coil attached to the test subject. Then, the processing circuitry selects statistical information about the attachment position of the RF coil based on the image-related information. Subsequently, the processing circuitry outputs the attachment position of the RF coil corresponding to the statistical information.

15 Claims, 9 Drawing Sheets

(51) Int. Cl.
*G06V 10/764* (2022.01)
*G06V 40/10* (2022.01)

(58) Field of Classification Search
CPC ............ A61B 2034/2055; G01R 33/00; G06T 2207/30196; G06V 40/10; G06V 10/764
See application file for complete search history.

(56) References Cited

U.S. PATENT DOCUMENTS

| | | | | |
|---|---|---|---|---|
| 2009/0021257 | A1* | 1/2009 | Yasuhara | A61B 5/055 |
| | | | | 324/318 |
| 2010/0030022 | A1* | 2/2010 | Graumann | A61B 6/4441 |
| | | | | 382/128 |
| 2012/0065476 | A1* | 3/2012 | Choi | G16H 40/63 |
| | | | | 600/300 |
| 2012/0254784 | A1* | 10/2012 | Vander Griend | ............... |
| | | | | G06Q 10/06315 |
| | | | | 715/771 |
| 2018/0314891 | A1* | 11/2018 | Ota | G16H 40/63 |

FOREIGN PATENT DOCUMENTS

| | | | | |
|---|---|---|---|---|
| JP | 4718714 | B2 * | 7/2011 | ......... G01R 33/5611 |
| JP | 2018-008046 | A | 1/2018 | |
| JP | 2018-183525 | A | 11/2018 | |
| JP | 2021101852 | A * | 7/2021 | |

* cited by examiner

| STATIS-TICAL ID | BODY TYPE (HEIGHT) | POSTURE | TEST SUBJECT POSITION | REGION TO BE SCANNED | COIL TYPE | COIL ATTACH-MENT POSITION |
|---|---|---|---|---|---|---|
| 001 | 150-160 | SUPINE | (X1, Y1) | ABDOMEN | COIL FOR ABDOMEN | (x1, y1) |
| 002 | 150-160 | SIDEWAYS | (X2, Y2) | ABDOMEN | COIL FOR ABDOMEN | (x2, y2) |
| 003 | 160-170 | PRONE | (X3, Y3) | LEG | COIL FOR LEGS | (x3, y3) |

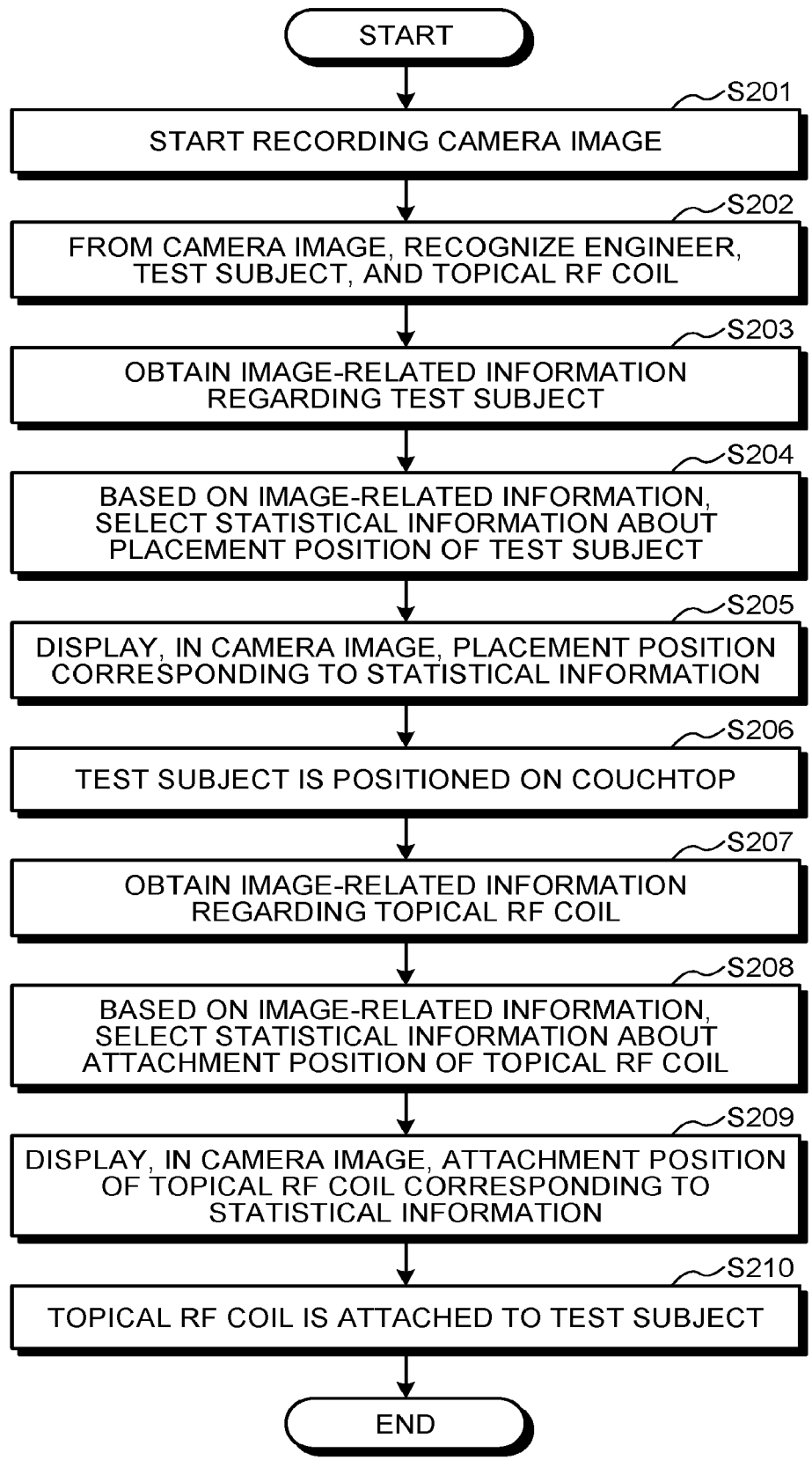

MAGNETIC RESONANCE IMAGING DEVICE, ATTACHMENT POSITION OUTPUT METHOD, AND STORAGE MEDIUM

CROSS-REFERENCE TO RELATED APPLICATIONS

This application is based upon and claims the benefit of priority from Japanese Patent Application No. 2021-022262, filed on Feb. 16, 2021; the entire contents of which are incorporated herein by reference.

FIELD

Embodiments described herein relate generally to a magnetic resonance imaging device, an attachment position output method, and a storage medium.

BACKGROUND

Conventionally, in the examination performed using a magnetic resonance imaging (MRI) device, a radio frequency (RF) coil meant for receiving magnetic resonance signals is placed in the vicinity of the test subject, and then imaging is performed. For example, imaging is performed by attaching an RF coil to the test subject who is positioned on a couchtop. In such type of imaging, the position of the RF coil, which is attached to the test subject, sometimes affects the quality of the images obtained as a result of performing imaging.

BRIEF DESCRIPTION OF THE DRAWINGS

FIG. 6 is a flowchart for explaining the sequence of operations performed in the MRI device according to a second modification example of the first embodiment;

DETAILED DESCRIPTION

In the embodiments disclosed in the present written description and the drawings, one of the problems to be solved is to enhance the reproducibility of imaging. However, that is not the only problem to be solved in the embodiments disclosed in the present written description and the drawings. That is, the problems corresponding to the effects attributed to the configurations explained below in the embodiments can be treated as other problems.

A magnetic resonance imaging device according to an embodiment includes processing circuitry. The processing circuitry obtains, from an image of a test subject taken by an optical photographing device, image-related information regarding at least either the test subject or a radio frequency (RF) coil attached to the test subject. Then, the processing circuitry selects statistical information about the attachment position of the RF coil based on the image-related information. Subsequently, the processing circuitry outputs the attachment position of the RF coil corresponding to the statistical information.

Exemplary embodiments of a magnetic resonance imaging device, an attachment position output method, and a storage medium are described below with reference to the accompanying drawings. However, the embodiments are not limited to the embodiments described below. Moreover, the details given in a particular embodiment are applicable in principle to other embodiments in an identical manner.

First Embodiment

Figure 1:
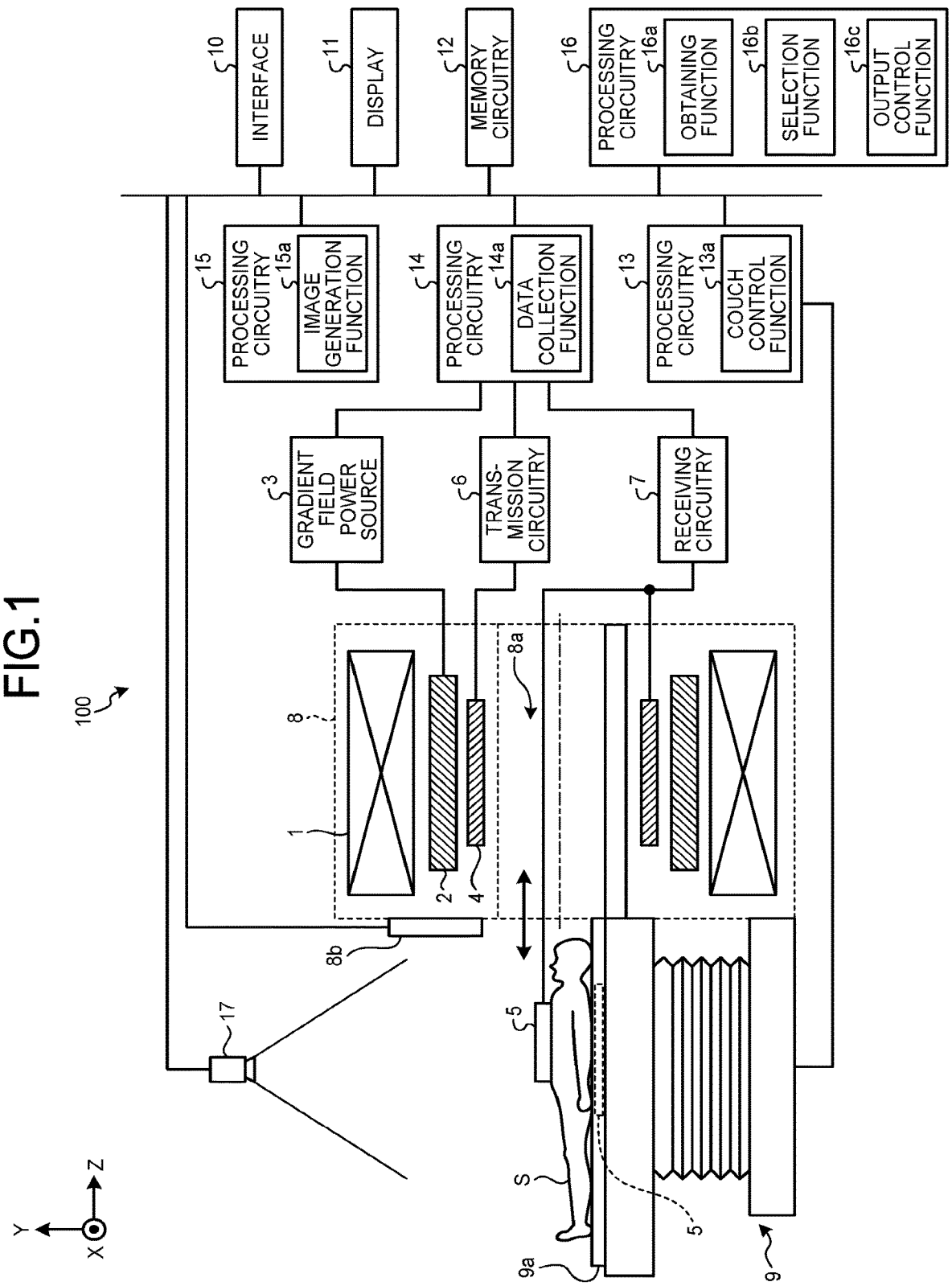
FIG. 1 is a diagram illustrating an exemplary configuration of an MRI device according to a first embodiment.

FIG. 1 is a diagram illustrating an exemplary configuration of an MRI device according to a first embodiment. For example, as illustrated in FIG. 1, an MRI device 100 includes a magnetostatic magnet 1, a gradient coil 2, a gradient field power source 3, a whole-body RF coil 4, a topical RF coil 5, a transmission circuitry 6, receiving circuitry 7, a mount 8, a couch 9, an interface 10, a display 11, memory circuitry 12, processing circuitries 13 to 16, and a camera 17.

The magnetostatic magnet 1 generates a magnetostatic field in the imaging space in which a test subject S (an object under examination) is positioned. For example, the magnetostatic magnet 1 is hollow and has a substantially cylindrical shape (including an elliptical cross-sectional surface orthogonal to the central axis); and generates a magnetostatic field in the imaging space formed in its inner periphery side. For example, the magnetostatic magnet 1 is a superconducting magnet or a permanent magnet. A superconducting magnet is made of, for example, a container in which a coolant such as liquid helium is filled, and a superconducting coil that is immersed in the container.

The gradient coil 2 is placed on the inside of the magnetostatic magnet 1, and generates a gradient magnetic field in the imaging space in which the test subject S is positioned. More particularly, the gradient coil 2 is hollow and has a substantially cylindrical shape (including an elliptical cross-sectional surface orthogonal to the central axis); and includes an X coil, a Y coil, and a Z coil corresponding to the X axis, the Y axis, and the Z axis, respectively, that are orthogonal to each other. Based on the electric current supplied from the gradient field power source 3; the X coil, the Y coil, and the Z coil generate gradient fields, which linearly vary in the respective axis directions, in the imaging space. The Z axis is set to run along the magnetic flux of the magnetostatic field that is generated by the magnetostatic magnet 1. The X axis is set to run along the horizontal direction that is orthogonal to the Z axis, and the Y axis is set to run along the vertical direction that is orthogonal to the Z axis. With that, the X axis, the Y axis, and the Z axis constitute a device coordinate system specific to the MRI device 100.

The gradient field power source 3 supplies an electric current to the gradient coil 2, and thus generates a gradient field in the imaging space. More particularly, the gradient field power source 3 individually supplies an electric current to each of the X coil, the Y coil, and the Z coil of the gradient coil 2; and thus generates, in the imaging space, gradient fields that linearly change along the lead-out direction, the phase encoding direction, and the slice direction, respectively, that are orthogonal to each other. In the following explanation, the gradient field running along the lead-out direction is called a lead-out gradient field; the gradient field running along the phase encoding direction is called a phase encoding gradient field; and the gradient field running along the slice direction is called a slice gradient field.

The lead-out gradient field, the phase encoding gradient field, and the slice gradient field get superposed on the magnetic field generated by the magnetostatic magnet 1, thereby resulting in the assignment of spatial position information to the magnetic resonance signals generated from the test subject S. More particularly, the lead-out gradient field varies the frequency of the magnetic resonance signals according to the position in the lead-out direction, thereby resulting in the assignment of position information along the lead-out direction to the magnetic resonance signals. The phase encoding gradient field varies the frequency of the magnetic resonance signals according to the position in the phase encoding direction, thereby resulting in the assignment of position information along the phase encoding direction to the magnetic resonance signals. The slice gradient field results in the assignment of position information along the slice direction to the magnetic resonance signals. For example, when the imaging regions are in the form of slice regions (2D imaging), the slice gradient field is used in deciding on the direction, the thickness, and the count of the slice regions. On the other hand, when the imaging regions are in the form of volume regions (3D imaging), the slice gradient field is used in varying the phase of the magnetic resonance signals according to the position of the slice direction. As a result, the axis along the lead-out direction, the axis along the phase encoding direction, and the axis along the slice direction constitute a logical coordinate system meant for stipulating the slice regions or the volume regions to be subjected to imaging.

The whole-body RF coil 4 is placed on the inner periphery side of the gradient coil 2; and transmits a high frequency magnetic field to the test subject S who is present in the imaging space, and receives the magnetic resonance signals generated from the test subject S due to the effect of the high frequency magnetic field. More particularly, the whole-body RF coil 4 is hollow and has a substantially cylindrical shape (including an elliptical cross-sectional surface orthogonal to the central axis); and, based on radiofrequency pulse signals supplied from the transmission circuitry 6, transmits a high frequency magnetic field to the subject S present in the imaging space that is formed on the inner periphery side of the whole-body RF coil 4. Moreover, the whole-body RF coil 4 receives magnetic resonance signals that are generated from the test subject S due to the effect of the high frequency magnetic field, and outputs the received magnetic resonance signals to the receiving circuitry 7.

The topical RF coil 5 receives the magnetic resonance signals generated from the test subject S. More particularly, a plurality of types of topical RF coils 5 is made available in order to cater to the different body regions of the test subject S. At the time of performing imaging of the test subject S, the topical RF coil 5 is placed in the vicinity of the surface of the target body region for imaging. Then, the topical RF coil 5 receives the magnetic resonance signals that are generated from the test subject S due to the effect of the high frequency magnetic field transmitted by the whole-body RF coil 4; and outputs the received magnetic resonance signals to the receiving circuitry 7. Meanwhile, the topical RF coil 5 can also have the function of transmitting a high frequency magnetic field onto the test subject S. In that case, the topical RF coil 5 is connected to the transmission circuitry 6 and, based on the radiofrequency pulse signals supplied from the transmission circuitry 6, transmits a high frequency magnetic field onto the test subject S. For example, the topical RF coil 5 either is a surface coil or is a phased array coil that is configured by combining a plurality of surface coils as elements (coil elements). That is, the topical RF coil 5 is not an element itself, but is a coil device having one or more elements stored in a housing. Meanwhile, the topical RF coil 5 is sometimes simply referred to as the "RF coil".

The transmission circuitry 6 outputs, to the whole-body RF coil 4, radiofrequency pulse signals that correspond to the Larmor frequency specific to the target nucleus placed in the magnetostatic field. More particularly, the transmission circuitry 6 includes a pulse generator, a radiofrequency generator, a modulator, and an amplifier. The pulse generator generates the waveforms of radiofrequency pulse signals. The radiofrequency generator generates radiofrequency signals having the Larmor frequency. The modulator modulates the amplitude of the radiofrequency signals, which are generated by the radiofrequency generator, with the waveforms generated by the pulse generator; and generates radiofrequency pulse signals. The amplifier amplifies the radiofrequency pulse signals generated by the modulator, and outputs the amplified radiofrequency pulse signals to the whole-body RF coil 4.

The receiving circuitry 7 generates magnetic resonance data based on the magnetic resonance signals output from the whole-body RF coil 4 or the topical RF coil 5, and outputs the magnetic resonance data to processing circuitry 14. For example, the receiving circuitry 7 includes a selector, a previous-stage amplifier, a phase sensitive detector, and an analog/digital (A/D) converter. The selector inputs, in a selective manner, the magnetic resonance signals that are output from the whole-body RF coil 4 and the topical RF coil 5. The previous-stage amplifier performs power amplification of the magnetic resonance signals output from the selector. The phase sensitive detector detects the phase of the magnetic resonance signals output from the previous-stage amplifier. The A/D converter converts the analog signals, which are output from the phase sensitive detector, into digital signals so as to generate magnetic resonance data; and outputs the generated magnetic resonance data to the processing circuitry 14. Meanwhile, the operations that are assumed to be performed in the receiving circuitry 7 need not always be entirely performed in the receiving circuitry 7; and some of the operations (such as the operation of the A/D converter) can be performed in the whole-body RF coil 4 or the topical RF coil 5.

The mount 8 has a hollow bore 8a formed in a substantially cylindrical shape (including the shape having an elliptical cross-sectional surface orthogonal to the central axis)); and has the magnetostatic magnet 1, the gradient coil 2, and the whole-body RF coil 4 housed therein. More particularly, in the mount 8, the whole-body RF coil 4 is disposed on the outer periphery side of the bore 8a; the gradient coil 2 is disposed on the outer periphery side of the whole-body RF coil 4; and the magnetostatic magnet 1 is disposed on the outer periphery side of the gradient coil 2.

The space inside the bore 8a of the mount 8 serves as the imaging space into which the test subject S is positioned during imaging. Meanwhile, the mount 8 includes a mount monitor 8b. The mount monitor 8b represents an example of a display unit.

The couch 9 includes a couchtop 9a on which the test subject S is positioned, and includes a movement mechanism for moving the couchtop 9a in the up-down direction and the horizontal direction. The up-down direction represents the vertical direction, and the horizontal direction represents the direction running along the central axis of the magnetostatic magnet 1. With such a configuration of the couch 9, the couchtop 9a can be moved in the up-down direction for changing its height. Moreover, in the couch 9, the couchtop 9a can be moved in the horizontal direction for changing its position in between the space on the outside of the mount 8 and the imaging space formed within the bore 8a on the inside of the mount 8.

Herein, the explanation is given about the case in which the MRI device 100 has, what is called, a tunnel structure because of the substantially cylindrical shape of the magnetostatic magnet 1, the gradient coil 2, and the whole-body RF coil 4. However, the first embodiment is not limited to that case. Alternatively, for example, the MRI device 100 can have, what is called, an open structure in which a pair of magnetostatic magnets, a pair of gradient coils, and a pair of RF coils are disposed across the imaging space in which the test subject S is positioned. In such an open structure, the space sandwiched between the pair of magnetostatic magnets, the pair of gradient coils, and the pair of RF coils is equivalent to the bore in a tunnel structure.

The interface 10 receives input operations of various instructions and a variety of information from the operator. More particularly, the interface 10 is connected to the processing circuitry 16; and converts an input operation received from the operator into an electrical signal and outputs it to the processing circuitry 16. For example, the interface 10 is implemented using a trackball meant for setting the imaging conditions and the region of interest (ROI); or using switch buttons; or using a mouse; or using a keyboard; or using a touchpad meant for performing input operations by touching an operation screen; or using a touchscreen configured by integrating a display screen and a touchpad; or using a contactless input circuitry in which an optical sensor is used; or using a voice input circuitry. In the present written description, the interface 10 is not limited to include physical operating components such as a mouse and a keyboard. Alternatively, examples of the interface 10 also include an electrical-signal processing circuitry that receives an electrical signal corresponding to an input operation from an external input device disposed separately from the device, and outputs the electrical signal to a control circuitry.

The display 11 is used to display a variety of information and various images. More particularly, the display 11 is connected to the processing circuitry 16; and converts a variety of information and a variety of image data, which is sent from the processing circuitry 16, into electrical signals and outputs the electrical signals. For example, the display 11 is implemented using a liquid crystal monitor, a CRT monitor, or a touch-sensitive panel.

The memory circuitry 12 is used to store a variety of data. More particularly, the memory circuitry 12 is used to store magnetic resonance data and image data. For example, the memory circuitry 12 is implemented using a semiconductor memory device such as a random access memory (RAM) or a flash memory; or using a hard disk; or using an optical disk. The memory circuitry 12 represents an example of a memory unit.

The processing circuitry 13 includes a couch control function 13a. The couch control function 13a controls the operations of the couch 9 by outputting electrical signals for control to the couch 9. For example, the couch control function 13a receives, from the operator via the interface 10 or via an operation panel installed on the mount 8, an instruction to move the couchtop 9a in the up-down direction or the horizontal direction; and accordingly operates a movement mechanism of the couch 9 in such a way that the couchtop 9a moves according to the received instruction. For example, at the time of performing imaging of the test subject S, the couch control function 13a moves the couchtop 9a, on which the test subject S is positioned, to the imaging space formed within the bore 8a on the inside of the mount 8.

The processing circuitry 14 includes a data collection function 14a. The data collection function 14a executes various pulse sequences and collects the magnetic resonance data of the test subject S. More particularly, the data collection function 14a drives the gradient field power source 3, the transmission circuitry 6, and the receiving circuitry 7 according to sequence execution data output from the processing circuitry 16, and executes various pulse sequences. The sequence execution data indicates the pulse sequences and has the following information stipulated therein: the timing at which the gradient field power source 3 supplies an electric current to the gradient coil 2, and the intensity of the electric current; the timing at which the transmission circuitry 6 supplies radiofrequency pulse signals to the whole-body RF coil 4, and the intensity of the radiofrequency pulses; and the timing at which the receiving circuitry 7 samples magnetic resonance signals. Then, the data collection function 14a receives magnetic resonance data output from the receiving circuitry 7 as the result of executing the pulse sequences, and stores the magnetic resonance data in the memory circuitry 12. At that time, the magnetic resonance data stored in the memory circuitry 12 gets assigned with the position information along the lead-out direction, the phaseout direction, and the slice direction attributed to the lead-out gradient field, the phase encoding gradient field, and the slice gradient field, respectively. As a result, the magnetic resonance data gets stored as the data representing a two-dimensional k-space or a three-dimensional k-space.

The processing circuitry 15 includes an image generation function 15a. The image generation function 15a generates a variety of images based on the magnetic resonance data collected by the processing circuitry 14. More particularly, the image generation function 15a reads the magnetic resonance data, which is collected by the processing circuitry 14, from the memory circuitry 12; performs reconstruction such as Fourier transform with respect to the read magnetic resonance data; and generates two-dimensional images or three-dimensional images. Then, the image generation function 15a stores the generated images in the memory circuitry 12.

The processing circuitry 16 controls the constituent elements of the MRI device 100, and thus performs overall control of the MRI device 100. More particularly, the processing circuitry 16 displays, in the display 11, a graphical user interface (GUI) meant for receiving input operations of various instructions and a variety of information from the operator; and, according to the input operations received via the interface 10, controls the constituent elements of the MRI device 100. For example, the processing circuitry 16 generates sequence execution data based on the imaging conditions input by the operator; outputs the sequence execution data to the processing circuitry 14; and collects the magnetic resonance data. Moreover, for example, the processing circuitry 16 controls the processing circuitry 15, and generates images based on the magnetic resonance data collected by the processing circuitry 14. Furthermore, for example, in response to a request received from the operator, the processing circuitry 16 reads the images stored in the memory circuitry 12 and displays them in the display 11.

The processing circuitry 16 includes an obtaining function 16a, a selection function 16b, and an output control function 16c. The obtaining function 16a represents an example of an obtaining unit. The selection function 16b represents an example of a selecting unit. The output control function 16c represents an example of an output control unit. Regarding the operations performed by the obtaining function 16a, the selection function 16b, and the output control function 16c; the explanation is given later.

Each of the abovementioned processing circuitries is implemented using, for example, a processor. In that case, the processing functions of each processing circuitry are stored as, for example, computer-executable programs in the memory circuitry 12. Each processing circuitry reads the corresponding computer programs from the memory circuitry 12 and executes them, so that the processing functions corresponding to the computer programs get implemented. In other words, as a result of reading the computer programs, each processing circuitry gets equipped with the corresponding functions as illustrated in FIG. 1.

Herein, although it is explained that each processor is implemented using a single processor, it is alternatively possible to configure each processing circuitry by combining a plurality of independent processors, and each of those processors can implement processing functions by executing computer programs. Moreover, the processing functions of each processing circuitry can be implemented in a dispersed manner among a plurality of processing circuitries or in an integrated manner in a single processing circuitry. Meanwhile, in the example illustrated in FIG. 1, a single memory circuitry 12 is used to store the computer programs corresponding to the processing functions. Alternatively, a plurality of memory circuitries can be disposed in a dispersed manner, and the processing circuitry can read computer programs from different memory circuitries.

The constituent elements of the MRI device 100 are disposed, in a divided manner, in a photographing room that is created as a shield room in which the space is shielded from electromagnetic radiation, and in an operating room in which the MRI device 100 is operated. For example, the magnetostatic magnet 1, the gradient coil 2, the whole-body RF coil 4, the topical RF coil 5, the receiving circuitry 7, the mount 8, the couch 9, and the processing circuitry 13 are disposed in the photographing room; while the gradient field power source 3, the transmission circuitry 6, the interface 10, the display 11, the memory circuitry 12, and the processing circuitries 14 to 16 are disposed in the operating room. Apart from the photographing room and the operating room, if a machine room is also provided, then some or all of the gradient field power source 3, the transmission circuitry 6, the memory circuitry 12, and the processing circuitries 14 to 16 can be disposed in the machine room.

The camera 17 is an optical photographing device disposed above the couch 9. For example, the camera 17 is attached to the ceiling of the photographing room, and is used to take bird's-eye view images of the surrounding of the couch 9. The images taken by the camera 17 are recorded in, for example, the memory circuitry 12 or an external memory device such as the picture archiving and communication system (PACs). The images taken by the camera 17 are referred to as "camera images" or "taken images".

Meanwhile, the camera 17 need not always be attached to the ceiling. Alternatively, for example, the camera 17 can be attached to an end portion of the mount 8 or the couch 9, or can be attached to a wall present around the mount 8 or the couch 9. Moreover, with reference to FIG. 1, the explanation is given for the case in which a single camera 17 is used. However, it is possible to have two or more cameras 17.

Furthermore, with reference to FIG. 1, the explanation is given about the case in which the camera 17 is included in the MRI device 100. However, the camera 17 need not always be included in the MRI device 100. For example, at the time of shipment of the MRI device 100, the camera 17 need not be included therein; and, after the installation of the MRI device 100 is completed, the camera 17 can be connected as an external device.

Meanwhile, in an MRI device, the attachment position of the topical RF coil affects the reproducibility of imaging. For example, the attachment of the topical RF coil is done by an engineer (operator) in an intuitive manner based on the skill and the experience. Hence, there are times when the attachment position of the topical RF coil is out of alignment. For that reason, even if the same scanning conditions are applied for taking images of a particular region for scanning, in case the attachment position of the topical RF coil is out of alignment, then it leads to variability in the quality of the obtained images and the reproducibility of imaging undergoes a decline. Moreover, when the imaging of a particular test subject is to be repeatedly performed at regular intervals for follow-up purposes, in case the attachment position of the topical RF coil is out of alignment with respect to the attachment position in the previous instance of imaging, then there occurs a decline in the reproducibility of imaging. As a result of a decline in the reproducibility of imaging, it becomes difficult to find minute abnormal changes occurring in the affected part, which may affect the image diagnosis of the doctor.

In that regard, the MRI device 100 according to the first embodiment implements the following processing functions in order to enhance the reproducibility of imaging.

That is, in the MRI device 100, the obtaining function 16a obtains, from the camera images of the test subject S as taken by the camera 17, image-related information regarding at least either the test subject S or the topical RF coil 5 that is attached to the test subject S. Then, based on the image-related information, the selection function 16b selects statistical information about the attachment position of the topical RF coil 5. The output control function 16c outputs the attachment position of the topical RF coil 5 corresponding to the statistical information. As a result, for example, the operator becomes able to attach the topical RF coil 5 to the test subject S while referring to the attachment position of the topical RF coil 5. That enables achieving enhancement in the reproducibility of imaging in the MRI device 100.

In the following explanation of the embodiments, the task in which the engineer (operator) attaches the topical RF coil 5 to the test subject S is referred to as "coil setting". For example, upon entering the photographing room along with the test subject S, the operator positions the test subject S on the couchtop 9a and performs coil setting. Once the coil setting is completed, the operator inserts the couchtop 9a, on which the test subject S is positions, into the bore 8a, and starts the imaging using the MRI device 100.

Moreover, in the following explanation of the embodiments, the "imaging" performed using the MRI device 100 is differentiated from the "photographing" performed using the camera 17. That is, the "imaging" implies creating images of the internal condition of the test subject S using the MRI device 100; and is also referred to as "scanning" or "MRI scanning". The "photographing" implies optically creating images of the situation within the field of vision of the camera 17.

Figure 2:
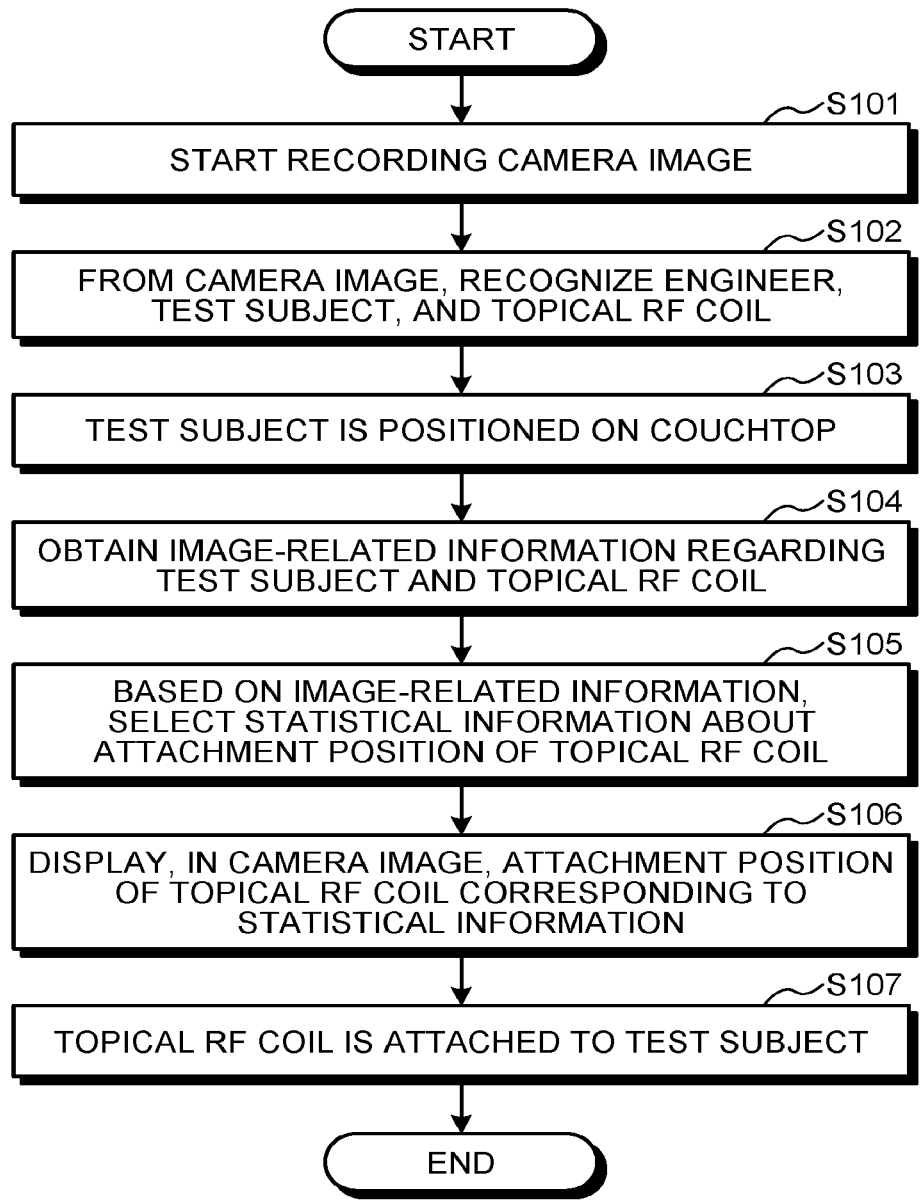
FIG. 2 is a flowchart for explaining the sequence of operations performed in the MRI device according to the first embodiment.

FIG. 2 is a flowchart for explaining the sequence of operations performed in the MRI device 100 according to the first embodiment. The sequence of operations illustrated in FIG. 2 is initiated at the timing of starting the coil setting. For example, the photographing is performed constantly using the camera 17; and, once a person is captured in a camera image, the sequence of operations illustrated in FIG. 2 is initiated. Alternatively, the sequence of operations illustrated in FIG. 2 can be initiated in response to an instruction from the operator.

When the coil setting is started, the processing circuitry 16 starts recording a camera image (Step S101). For example, once a person is captured in a camera image, the processing circuitry 16 starts recording the camera image. The processing circuitry 16 presents the recorded camera image to the operator as well as stores the camera image in the memory circuitry 12 or an external memory device such as the PACS.

Figures 3, 4:
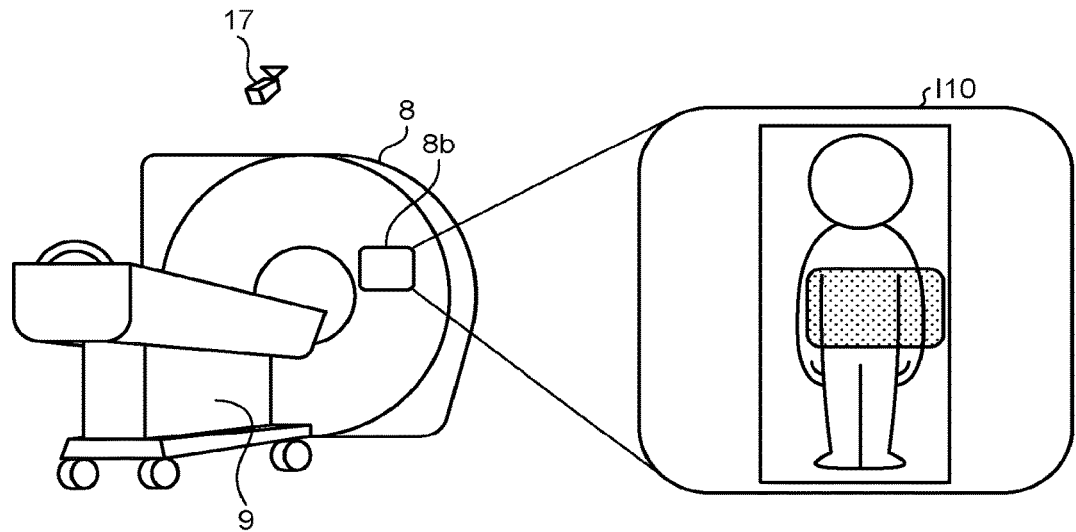
FIG. 3 is a diagram illustrating an exemplary camera image according to the first embodiment.
FIG. 4 is a diagram illustrating an example of a statistical information table according to the first embodiment.

FIG. 3 is a diagram illustrating an exemplary camera image according to the first embodiment. As illustrated in FIG. 3, for example, the camera 17 photographs, in real time, a camera image I10 from above the couch 9. Then, the output control function 16c displays the real-time camera image I10 in the mount monitor 8b that is installed in the mount 8. In the camera image I10, an image I11 of the test subject S and an image I12 of the topical RF coil 5 are captured. As a result, the operator becomes able to view, in the camera image I10, the real-time condition of the test subject around the couch 9.

In FIG. 3, as an example, the condition in which the topical RF coil 5 is already attached to the test subject S positioned on the couchtop 9a is captured in the image I10. However, that is not the only possible case. Alternatively, the camera image I10 can also provide a video of the real-time condition within the field of vision, such as the condition of an engineer or the test subject S approaching the couch 9 after entering the photographing room, or the condition when the test subject S sits on the couchtop 9a.

Then, the obtaining function 16a recognizes the engineer, the test subject S, and the topical RF coil 5 from the camera image (Step S102). For example, the obtaining function 16a individually recognizes the engineer, the test subject S, and the topical RF coil 5 based on their respective features captured in the camera image.

For example, the features of the engineer are to operate the operation panel of the mount 8 and adjust the position of the couchtop 9a. In that regard, when there is movement of the position of the couchtop 9a, the obtaining function 16a performs image recognition from the camera image. At that timing, the engineer is present near the operation panel and the subject S is present near the couch 9. Hence, from among the persons captured in the camera image, the obtaining function 16a recognizes the person present near the operation panel to be the "engineer" and recognizes the person present near the couch 9 to be the "test subject S". Alternatively, the obtaining function 16a can recognize the person other than the engineer as the "test subject S".

Moreover, the topical RF coil 5 is characterized by being attached to the test subject S at the hand of the engineer. In that regard, the obtaining function 16a performs image recognition of the object held by the engineer, and recognizes the topical RF coil 5.

Meanwhile, the image recognition operation explained above is only exemplary, and any known image recognition technology can be selected and implemented. For example, in the case of recognizing a person from a camera image, it is possible to implement the skeletal frame recognition technology.

Meanwhile, the features of the engineer, the test subject S, and the topical RF coil 5 are not limited to the example given above. For example, the engineer can be recognized using the features such as the work outfit meant for engineers and the nameplate of the engineer. The test subject S can be recognized using the features such as the medical examination output, the wheelchair, and the stretcher. The topical RF coil 5 can be recognized not only using the features captured in the image but also using the information obtained from its connector that is plugged in a coil port of the couch 9. Alternatively, the topical RF coil 5 can be recognized by providing therein a wireless tag such as a radio frequency identifier (RFID) tag.

Subsequently, the test subject S is positioned on the couchtop 9a (Step S103). For example, the test subject S climbs up the couchtop 9a according to the instruction from the engineer and waits in the instructed posture.

Then, the obtaining function 16a obtains the image-related information regarding the test subject S and the topical RF coil 5 (Step S104). For example, as the image-related information, the obtaining function 16a obtains information indicating the body type of the test subject S, the posture of the test subject S, and the position of the test subject S.

For example, the obtaining function 16a obtains the height of the test subject as the information indicating the body type. As an example, the obtaining function 16a measures the height of the subject S using the camera image in which the subject S is captured lying down on the couchtop 9a. However, the information indicating the body type of the test subject S is not limited to the height. Alternatively, the obtaining function 16a can obtain at least either the height, or the thickness of the abdomen, or the width of the abdomen, or the length of the hands and feet of the test subject S as the information indicating the body type of the test subject S. The thickness of the abdomen can be measured from the color image taken when the test subject S is facing sideways with respect to the photographing direction of the camera 17. The width of the abdomen can be measured from the color image taken when the test subject S is facing toward or against the photographing direction of the camera 17.

Moreover, as the information indicating the posture of the test subject S, the obtaining function 16a obtains information indicating whether the test subject S is lying in a supine position, or lying in a prone position, or lying sideways. As an example, the obtaining function 16a performs image recognition with respect to a camera image taken before (or immediately before) the topical RF coil 5 is attached to the test subject S, and obtains the information indicating the posture of the test subject S. In the image recognition, the posture can be recognized using templates corresponding to postures or using skeletal frame recognition. Meanwhile, whether or not the topical RF coil 5 has been attached can be determined according to the timing of appearance of the topical RF coil 5 (or the engineer) at the couchtop 9a or the timing of plugging the connector of the topical RF coil 5 in the coil port of the couch 9.

Furthermore, as the information indicating the position of the test subject S, the obtaining function 16a obtains the position information (coordinates) of the test subject S in a camera image. As an example, the position information in a camera image is defined by the coordinate system in which the vertical direction in the camera image represents the y-axis and the horizontal direction represents the z-axis. From the camera image in which the test subject S is captured to be present on the couchtop 9a, the obtaining function 16a obtains the coordinates indicating the center position (the position of the center of gravity) of the test subject S. Meanwhile, instead of using the coordinate system in the camera image, the information indicating the position of the test subject S can be defined using an arbitrary coordinate system such as the coordinate system of the photographing room or the coordinate system of the couchtop 9a. Moreover, instead of using the center position, the position information of the test subject S can be defined using a plurality of coordinates such as the head region, the shoulders, the tip of the hands, and the tip of the feet.

Moreover, as the image-related information regarding the topical RF coil 5, the obtaining function 16a obtains the current attachment position at which the topical RF coil 5 is currently attached, and obtains the information indicating the type of the topical RF coil 5.

For example, as the current attachment position of the topical RF coil 5, the obtaining function 16a obtains the position information (coordinates) of the topical RF coil 5 in the camera image. As an example, from the camera image in which the topical RF coil 5 is captured in the state of being attached to the test subject S, the obtaining function 16a obtains the coordinates indicating the center position (the position of the center of gravity) of the topical RF coil 5. The center position of the topical RF coil 5 can be defined using an arbitrary coordinate system such as the coordinate system of the photographing room or the coordinate system of the couchtop 9a. Alternatively, instead of using the center position, the position information of the topical RF coil 5 can be indicated by a plurality of arbitrarily-specified coordinates such as the four corners of the topical RF coil 5 or the characteristic structure thereof.

Moreover, as the information indicating the type of the topical RF coil 5, the obtaining function 16a obtains the information such as "coil for abdomen" or "coil for legs". As an example, the obtaining function 16a performs image recognition using the features of the topical RF coil 5 as captured in the image, and obtains the information indicating the type of the topical RF coil 5 from the camera image. The information indicating the type of the topical RF coil 5 is not limited to be based on the features captured in the image, and alternatively can be obtained using the information obtained from the connector of the topical RF coil 5 plugged in the coil port of the couch 9, or obtained by providing a wireless tag such as an RFID tag in the topical RF coil 5.

Moreover, the obtaining function 16a obtains the scanning conditions to be applied for the purpose of scanning the test subject. For example, the obtaining function 16a obtains, as the scanning conditions, information indicating the region to be scanned, the type of the coil, and coil identification information. The region to be scanned represents information indicating the body region such as the "abdomen" or "leg" of the test subject S that is to be scanned. The type of the coil represents information indicating the type of the topical RF coil 5 such as the "coil for abdomen" or the "coil for legs" to be used in scanning. The coil identification information represents identification information (a number or a symbol) assigned to each topical RF coil 5 for enabling unique identification of the topical RF coil 5 to be used in scanning. The scanning conditions are stored in an arbitrary memory area in the MRI device 100 and in a corresponding manner to a patient ID (identification) of the test subject S (patient) to be scanned.

In this way, the obtaining function 16a obtains the image-related information regarding the test subject S and the topical RF coil 5. Herein, the obtaining function 16a need not always obtain the information indicating the body type of the test subject S, the posture of the test subject S, as well as the position (coordinates) of the test subject S. That is, the obtaining function 16a can obtain information indicating at least either the body type of the test subject S, or the posture of the test subject S, or the position of the test subject S.

Moreover, the obtaining function 16a need not always obtain the current attachment position of the topical RF coil 5 as well as the type of the topical RF coil 5. That is, the obtaining function 16a can obtain the information indicating at least either the current attachment position of the topical RF coil 5 or the type of the topical RF coil 5.

Furthermore, the obtaining function 16a need not always obtain the information indicating the region to be scanned, the type of the coil, as well as the coil identification information. That is, the obtaining function 16a can obtain the information indicating at least either the region to be scanned, or the type of the coil, or the coil identification information.

Based on the image-related information, the selection function 16b selects the statistical information about the attachment position of the topical RF coil 5 (Step S105). For example, the selection function 16b selects the statistical information corresponding to the information indicating at least either the body type of the test subject, or the posture of the test subject, or the position of the test subject, or the attachment position of the coil, or the type of the coil, or the identification information of the coil, or the region to be scanned.

FIG. 4 is a diagram illustrating an example of a statistical information table according to the first embodiment. The statistical information table is stored in, for example, the memory circuitry 12. However, that is not the only possible case. Alternatively, the statistical information table can be stored in an arbitrary external memory device that is referable by the selection function 16b.

As illustrated in FIG. 4, for example, in the statistical information table, the following items are stored in a corresponding manner: "statistical ID", "body type", "posture", "test subject position", "region to be scanned", "coil type", and "coil attachment position".

The item "statistical ID" represents identification information enabling unique identification of the sets of statistical information stored in the statistical information table. In the statistical information table, information such as "001", "002", and "003" is stored as the statistical IDs. A statistical ID is not limited to be a numerical value, and can alternatively be information formed using characters, symbols, or a combination thereof.

The item "body type" represents information indicating the body type of the test subject; and, for example, indicates the height [cm]. In the statistical information table, information such as "150-160" and "160-170" is stored as the body type (height). However, the body type is not limited to indicate the height, and can be information indicating at least either the height, or the thickness of the abdomen, or the width of the abdomen, or the length of the hands and feet.

The item "posture" represents information indicating the posture of the subject. In the statistical information table, information such as "supine", "sideways", and "prone" is stored as the postures. However, the posture is not limited to those examples, and information indicating arbitrary postures can be set.

The item "test subject position" represents information indicating the position of the test subject; and, for example, is in the form of the coordinates indicating the center position (the position of the center of gravity) of the test subject captured in the camera image. In the statistical information table, information such as "(X1, Y1)", "(X2, Y2)", and "(X3, Y3)" is stored as the test subject position. The coordinates indicating the test subject position represent the average value of the coordinates indicating the test subject positions during a plurality of number of times of scanning performed in the past. Meanwhile, the test subject position is not limited to the coordinate system of the camera images, and an arbitrary coordinate system can be used such as the coordinate system of the photographing room or the coordinate system of the couchtop 9a. Moreover, the test subject position is not limited to the center position, and can be indicated by a plurality of other coordinates such as the head region, the shoulders, the tip of the hands, and the tip of the feet.

The item "region to be scanned" represents information indicating the body region of the test subject that is to be scanned. In the statistical information table, information indicating the body region such as "abdomen" or "leg" is stored as the region to be scanned. However, the region to be scanned is not limited to such information. Alternatively, information indicating an arbitrary region can also be set.

The item "coil type" represents information indicating the type of the topical RF coil. In the statistical information table, information such as the "coil for abdomen" or "coil for legs" is stored as the type of the coil. However, the type of the coil is not limited to such information, and information indicating an arbitrary coil type can also be set.

The item "coil attachment position" represents information indicating the position of the topical RF coil that is attached to the test subject during the scanning. For example, the item "coil attachment position" represents the coordinates indicating the center position (the position of the center of gravity) of the topical RF coil captured in the camera image. In the statistical information table, information such as "(x1, y1)", "(x2, y2)", and "(x3, y3)" is stored as the coil attachment position. The coordinates indicating the coil attachment position represent the average value of the coordinates indicating the coil attachment positions during a plurality of number of times of scanning performed in the past. Meanwhile, the coil attachment position is not limited to the coordinate system of the camera images, and an arbitrary coordinate system can be used such as the coordinate system of the photographing room or the coordinate system of the couchtop 9a. Moreover, the coil attachment position is not limited to the center position, and can be indicated by a plurality of arbitrarily-specified coordinates such as the four corners of the topical RF coil or the characteristic structure thereof.

For example, the statistical information table is used to store the following information in a corresponding manner: the statistical ID "001"; the body type "150-160"; the posture "supine"; the test subject position "(X1, Y1)"; the region to be scanned "abdomen"; the coil type "coil for abdomen"; and the coil attachment position "(x1, y1)". That is, the statistical information identified by the statistical ID "001" indicates that: regarding the scanning performed for a plurality of number of times under the conditions such as the body type indicating "150-160", the posture indicating "supine", the region to be scanned indicating "abdomen", and the coil type indicating "coil for abdomen"; the average test subject position is "(X1, Y1) and the average coil attachment position is "(x1, y1)". Regarding the statistical information identified by other statistical IDs too, the information is stored in an identical manner.

The statistical information table illustrated in FIG. 4 is only exemplary, and the information to be stored therein can be set in an arbitrary manner. For example, the statistical information table is used to store a plurality of sets of statistical information that are divided according to at least either the body type of the test subject, or the posture of the test subject, or the position of the test subject, or the attachment position of the coil, or the type of the coil, or the identification information of the coil, or the region to be scanned. Moreover, for example, the statistical information stored in the statistical information table is not limited to the statistical information identified by the statistical IDs "001", "002", and "003" illustrated in FIG. 4. Thus, the statistical information identified by other statistical IDs can also be stored. Furthermore, in the statistical information table, in addition to storing the average coordinates of the coil attachment position, the coordinates before taking the average can also be stored. For example, as the coil attachment positions during three times of scanning, information indicating "(x4, y4)", "(x5, y5)", and "(x6, y6)" can also be stored.

Then, the selection function 16b refers to the statistical information table and, from among a plurality of sets of statistical information stored in the statistical information table, selects the statistical information corresponding to the information obtained by the obtaining function 16a.

For example, the explanation is given for the case in which, as the information regarding the test subject S with respect to whom the coil setting is to be performed (i.e., regarding the person to be scanned), the obtaining function 16a obtains information about the height indicating "156 cm", the posture indicating "supine", the region to be scanned indicating "abdomen", and the coil type indicating "coil for abdomen". In that case, the selection function 16b refers to the statistical information table illustrated in FIG. 4, and searches for the statistical information corresponding to the information obtained by the obtaining function 16a. Then, from the statistical information table illustrated in FIG. 4, the selection function 16b selects the statistical information identified by the statistical ID "001".

In this way, based on the image-related information, the selection function 16b selects the statistical information about the attachment position of the topical RF coil 5. Meanwhile, the details explained above are only exemplary, and the first embodiment is not limited by that explanation. For example, the selection function 16b can select, as the statistical information, the information indicating at least either the body type of the test subject, or the posture of the test subject, or the position of the test subject, or the attachment position of the coil, or the type of the coil, or the region to be scanned, or the identification information of the coil.

For example, based on at least either the image-related information regarding the test subject S or the image-related information regarding the topical RF coil 5, the selection function 16b can select the statistical information about the attachment position of the topical RF coil 5. For example, when the "body type (height)" is obtained as the image-related information regarding the test subject S, the selection function 16b can select the statistical information based on the "body type (height)". Moreover, when the "coil type" is obtained as the image-related information regarding the topical RF coil 5, the selection function 16b can select the statistical information based on the "coil type".

Returning to the explanation with reference to FIG. 2, the output control function 16c displays, in the camera image, the attachment position of the topical RF coil 5 corresponding to the statistical information (Step S106). For example, the output control function 16c displays, in the mount monitor 8b, the coil attachment position corresponding to the statistical information selected by the selection function 16b.

Figure 5A:
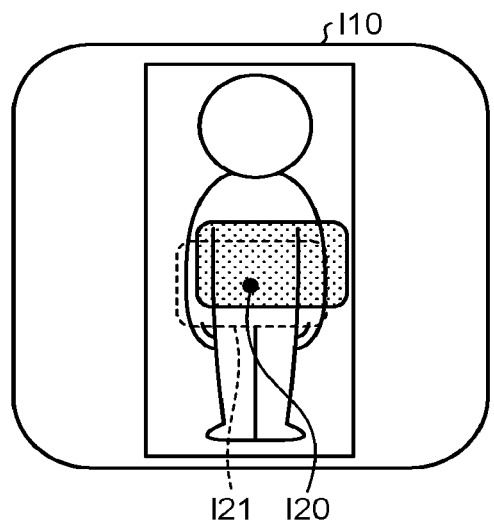
FIGS. 5A and 5B are diagrams illustrating examples of the display performed by an output control function according to the first embodiment.
Figure 5B:
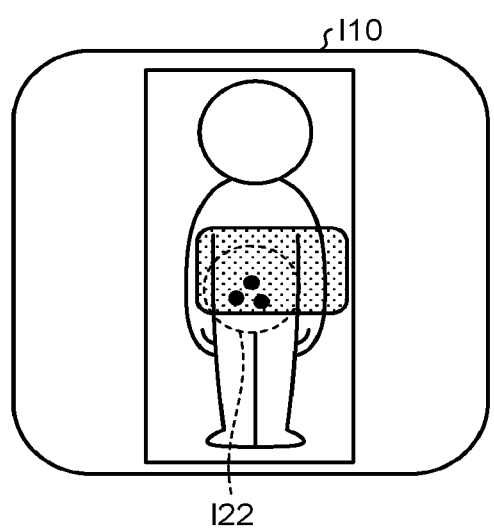

FIGS. 5A and 5B are diagrams illustrating examples of the display performed by the output control function 16c according to the first embodiment. In FIGS. 5A and 5B are illustrated the examples in which the coil attachment position corresponding to the statistical information is displayed in an overlapping manner in the camera image I10 that is being displayed in the mount monitor 8b.

In the example illustrated in FIG. 5A, the output control function 16c displays, in an overlapping manner in the real-time camera image I10, a center position image 120 and a profile position image 121. The center position image 120 is a point-shaped indicator of the average coil attachment position and is displayed at, for example, the coil attachment position "(x1, y1)" corresponding to the statistical information identified by the statistical ID "001". The profile position image 121 is a frame border indicator of the profile position of the topical RF coil 5 disposed at the average coil attachment position; and, for example, indicates the profile position in the case in which the "coil for abdomen" corresponding to the statistical information identified by the statistical ID "001" is displayed at the coil attachment position "(x1, y1)".

In the example illustrated in FIG. 5B, the output control function 16c displays, in an overlapping manner in the real-time camera image I10, three center position images 122. The three center position images 122 are indicators of the coil attachment positions during the three times of scanning performed before taking the average of the coil attachment positions. For example, the three center position images 122 are point-shaped indicators of the positions (coordinates) of the coil attachment positions "(x4, y4)", "(x5, y5)", and "(x6, y6)" during the three times of scanning.

In this way, in the display state illustrated in FIG. 5A or the display state illustrated in FIG. 5B, the output control function 16c displays the attachment position of the topical RF coil 5 in the camera image. Meanwhile, the display examples illustrated in FIGS. 5A and 5B are only exemplary, and the first embodiment is not limited by those examples. For example, the output control function 16c is not limited to display the center position image 120, the profile position image 121, and the three center position images 122; and can display the attachment position of the topical RF coil 5 in an arbitrary display form.

Moreover, in FIGS. 5A and 5B are illustrated the examples of the overlapping display in the camera image I10. However, the first embodiment is not limited by that example. Alternatively, for example, the overlapping display can be performed in a model image of a human body such as an illustration of a human body or the profile line of a human body. That is, the output control function 16c can display the coil attachment position, which corresponds to the statistical information, in an overlapping manner either in an image of the test subject S as taken by a camera or in a model image of a human body.

Meanwhile, the display of the attachment position is not necessarily limited to the overlapping display. For example, the output control function 16c can display the attachment position, which corresponds to the statistical information, side by side with the camera image I10.

The display unit (display device) in which the attachment position is to be displayed is not limited to the mount monitor 8b. For example, the output control function 16c can display the attachment position in some other arbitrary display unit such as a monitor, a display, or a tablet other than the mount monitor 8b. However, it is preferable that the display unit for displaying the attachment position is installable in or portable to the photographing room.

The output form for the output control function 16c is not limited to the image display in a display unit. Alternatively, for example, the output can be performed in the form of a voice or in the form of projection using a projector (projection mapping). Regarding the projection using a projector, the explanation is given later.

Returning to the explanation with reference to FIG. 2, the topical RF coil 5 is attached to the test subject S (Step S107). For example, the engineer refers to the attachment position of the topical RF coil 5 as displayed in the mount monitor 8b, and accordingly attaches the topical RF coil 5 to the test subject S. Once it is determined that the topical RF coil 5 is attached at the appropriate attachment position, the engineer plugs the connector of the topical RF coil 5 in the coil port of the couch 9, and completes the coil setting. Once the coil setting is completed, the couchtop 9a on which the test subject is positioned is inserted into the bore 8a; and the scanning is started.

Meanwhile, in the operation performed at Step S107, as long as the attachment position of the topical RF coil 5 is finalized, it serves the purpose. For example, after the operation performed at Step S103, the engineer can keep the topical RF coil 5 on or near the body of the test subject S; and, in the operation performed at Step S107, adjust the attachment position of the topical RF coil 5 as may be necessary, so that the attachment position is finalized.

The sequence of operations explained with reference to FIG. 2 is only exemplary, and the first embodiment is not limited by that sequence of operations. For example, the sequence of operations illustrated in FIG. 2 can be arbitrarily changed without causing any contradictions in the operation details. For example, the operations at Steps S104 and S105 can be performed before the operation performed at Step S103.

As explained above, in the MRI device 100 according to the first embodiment, from a camera image of the test subject S as taken by the camera 17, the obtaining function 16a obtains the image-related information regarding at least either the test subject S or the topical RF coil 5 that is attached to the test subject S. Then, based on the image-related information, the selection function 16b selects the statistical information about the attachment position of the topical RF coil 5. The output control function 16c outputs the attachment position of the topical RF coil 5 corresponding to the statistical information. As a result, in the MRI device 100, it becomes possible to enhance the reproducibility of imaging.

For example, based on a plurality of sets of statistical information, the MRI device 100 presents the preferred attachment position of the topical RF coil 5 to the engineer. Hence, the engineer can refer to the preferred attachment position of the topical RF coil 5, and accordingly attach the topical RF coil 5 to the test subject S. As a result, in the MRI device 100, the reproducibility of imaging can be enhanced without having to depend on the experience and the skill of the engineer.

First Modification Example of First Embodiment

For example, in the first embodiment described above, the output control function 16c can also report information notifying that the topical RF coil 5 has been attached at the attachment position.

For example, the output control function 16c determines whether or not the topical RF coil 5 is attached to the attachment position. The determination about whether or not the topical RF coil 5 is attached to the attachment position is performed automatically via image recognition with respect to the camera image I10. For example, the output control function 16c compares the current attachment position of the topical RF coil 5 as recognized from the camera image I10 with the attachment position corresponding to the statistical information. If the distance between the current attachment position of the topical RF coil 5 and the attachment position corresponding to the statistical information is within a predetermined range (smaller than a threshold value), then the output control function 16c determines that the topical RF coil 5 is attached to the attachment position. When it is determined that the topical RF coil 5 is attached to the attachment position; for example, the output control function 16c displays a message such as "The RF coil has been attached to the preferred attachment position" in the mount monitor 8b.

However, regarding the information indicating that the topical RF coil 5 has been attached to the attachment position, the output form is not necessarily limited to a message. Alternatively, for example, the output control function 16c can change the color of the camera image I10 or the color of the frame border of the profile position image 121, or can hide the center position image 120, so as to report information notifying that the topical RF coil 5 has been attached to the attachment position.

Moreover, regarding the information indicating that the topical RF coil 5 has been attached to the attachment position, the output form need not be one of different display forms. For example, the output control function 16c can voice-output a message such as "the RF coil has been attached to the preferred attachment position", or can notify the same using sound effects or vibrations.

Second Modification Example of First Embodiment

In the first embodiment described above, the explanation is given for the case in which the attachment position of the topical RF coil 5 is output. However, the first embodiment is not limited by that case. Alternatively, for example, the MRI device 100 can output the placement position of the test subject S.

That is, in the MRI device 100 according to a second modification example of the first embodiment, based on the image-related information, the selection function 16b selects the statistical information about the placement position of the test subject S. Then, the output control function outputs the placement position of the test subject S along with the attachment position of the topical RF coil 5.

FIG. 6 is a flowchart for explaining the sequence of operations performed in the MRI device 100 according to the second modification example of the first embodiment. In the sequence of operations illustrated in FIG. 6, the operations performed at Steps S203 and S204 are different than the sequence of operations illustrated in FIG. 2.

The sequence of operations illustrated in FIG. 6 is initiated at, for example, the timing of starting the coil setting. The initiation condition for the sequence of operations illustrated in FIG. 6 is identical to the initiation condition for the sequence of operations illustrated in FIG. 2.

When the coil setting is started, the processing circuitry 16 starts recording a camera image (Step S201). The operation performed at Step S201 is identical to the operation performed at Step S101 illustrated in FIG. 2. Hence, that explanation is not given again.

Then, the obtaining function 16a recognizes the engineer, the test subject S, and the topical RF coil 5 from the camera image (Step S202). The operation performed at Step S202 is identical to the operation performed at Step S102 illustrated in FIG. 2. Hence, that explanation is not given again.

Then, the obtaining function 16a obtains the image-related information regarding the test subject S (Step S203). For example, the obtaining function 16a obtains information indicating at least either the body type of the test subject S, or the posture of the test subject S, or the position of the test subject S. The operation performed at Step S203 is identical to the operation for obtaining the image-related information regarding the test subject S from among the operations performed at Step S104 illustrated in FIG. 2. Hence, that explanation is not given again. Moreover, if, at that point of time, the topical RF coil 5 is captured in the camera image; the obtaining function 16a can also obtain the image-related information regarding the topical RF coil 5.

Subsequently, based on the image-related information, the selection function 16b selects the statistical information about the placement position of the test subject S (Step S204). For example, the selection function 16b selects the statistical information corresponding to the information indicating at least either the body type of the test subject S, or the posture of the test subject S, or the position of the test subject S.

More particularly, the explanation is given for the case in which, regarding the test subject S with respect to whom the coil setting is to be performed (i.e., regarding the person to be scanned), the obtaining function 16a obtains information about the height indicating "156 cm" and the posture indicating "supine". In that case, the selection function 16b refers to the statistical information table illustrated in FIG. 4, and searches for the statistical information corresponding to the information obtained by the obtaining function 16a. Then, from the statistical information table illustrated in FIG. 4, the selection function 16b selects the statistical information identified by the statistical ID "001". The statistical information identified by the statistical ID "001" has the test subject position "(X1, Y1)" associated thereto. The test subject position represents an example of the placement position.

In this way, based on the image-related information regarding the test subject S, the selection function 16b selects the statistical information about the placement position of the test subject S.

Then, the output control function 16c displays the placement position corresponding to the statistical information in the camera image (Step S205). For example, the output control function 16c displays, in the mount monitor 8b, the test subject position "(X1, Y1)" corresponding to the statistical information selected by the selection function 16b.

Figure 7:
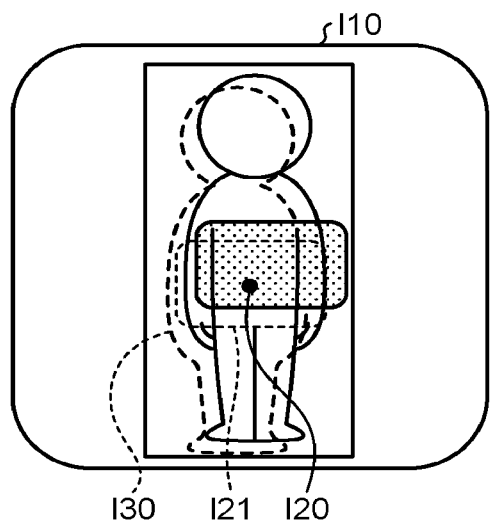
FIG. 7 is a diagram illustrating an example of the display performed by the output control function according to the second modification example of the first embodiment.

FIG. 7 is a diagram illustrating an example of the display performed by the output control function 16c according to the second modification example of the first embodiment. In FIG. 7 is illustrated the case in which the test subject position corresponding to the statistical information is displayed in an overlapping manner in the camera image I10 that is being displayed in the mount monitor 8b.

In the example illustrated in FIG. 7, the output control function 16c displays a profile position image 130 in an overlapping manner in the camera image I10. The profile position image 130 represents a frame border indicator of the profile position of the person positioned at the average test subject position. For example, the profile position image 130 indicates the profile position in the case in which the person having the body "150-160" corresponding to the statistical information identified by the statistical ID "001" is displayed at the test subject position "(X1, Y1)".

Moreover, in the example illustrated in FIG. 7, the output control function 16c displays, in an overlapping manner in the real-time camera image I10, the center position image 120 and the profile position image 121. The center position image 120 and the profile position image 121 can be displayed by performing identical operations to the operations explained with reference to FIG. 5A. Hence, that explanation is not given again.

In this way, in the display state illustrated in FIG. 7, the output control function 16c displays the placement position of the target subject S in the camera image. The display example is illustrated in FIG. 7 is only exemplary, and the first embodiment is not limited by that example. For example, the display of the placement position of the target subject S is not limited to the profile position image 130, and can be displayed in an arbitrary display form. For example, instead of using a dashed profile line, the profile position image 130 can be drawn in a semitransparent model image of a human body.

Meanwhile, in FIG. 7 is illustrated the example in which the attachment position of the topical RF coil 5 is displayed. However, that is not the only possible case. For example, until the test subject S is positioned on the couchtop 9a, the output control function 16c need not display the attachment position of the topical RF coil 5. The determination about whether or not the test subject S is positioned on the couchtop 9a can be manually performed by the engineer or can be automatically performed via image recognition with respect to the camera image I10.

Moreover, in FIG. 7 is illustrated the example of the overlapping display in the camera image I10. However, the first embodiment is not limited by that example. For example, the overlapping display can be performed in a model image of a human body such as an illustration of a human body or the profile line of a human body. Moreover, the display is not limited to the overlapping display. Alternatively, for example, the output control function 16c can display the placement position of the test subject S side by side with the camera image I10.

The display unit (display device) on which the placement position is to be displayed is not limited to the mount monitor 8b. For example, the output control function 16c can display the placement position in some other arbitrary display unit such as a monitor, a display, or a tablet other than the mount monitor 8b. However, it is preferable that the display unit for displaying the placement position is installable in or portable to the photographing room.

The output form for the output control function 16c is not limited to the image display in a display unit. Alternatively, for example, the output can be performed in the form of a voice or in the form of projection using a projector (projection mapping). Regarding the projection using a projector, the explanation is given later.

Returning to the explanation with reference to FIG. 6, the test subject S is positioned on the couchtop 9a (Step S206). For example, the test subject S climbs up the couchtop 9a and waits in the specified posture.

Then, the obtaining function 16a obtains the image-related information regarding the topical RF coil 5 (Step S207). For example, as the image-related information regarding the topical RF coil 5, the obtaining function 16a obtains information indicating the current attachment position at which the topical RF coil 5 is currently attached, and indicating the type of the topical RF coil 5. The operation performed at Step S207 is identical to the operation for obtaining the image-related information regarding the topical RF coil 5 from among the operations performed at Step S104 illustrated in FIG. 2. Hence, that explanation is not given again.

Subsequently, based on the image-related information, the selection function 16b selects the statistical information about the attachment position of the topical RF coil 5 (Step S208). The operation performed at Step S208 is identical to the operation performed at Step S105 illustrated in FIG. 2. Hence, that explanation is not given again.

Then, the output control function 16c displays, in the camera image, the attachment position of the topical RF coil 5 corresponding to the statistical information (Step S209). The operation performed at Step S209 is identical to the operation performed at Step S106 illustrated in FIG. 2. Hence, that explanation is not given again.

Subsequently, the topical RF coil 5 is attached to the test subject S (Step S210). The operation performed at Step S210 is identical to the operation performed at Step S107 illustrated in FIG. 2. Hence, that explanation is not given again.

In this way, the MRI device 100 according to the second modification example of the first embodiment can output the placement position of the test subject S. Hence, the engineer can refer to the preferred placement position of the test subject S, and position the test subject S on the couchtop 9a. As a result, in the MRI device 100, the reproducibility of imaging can be enhanced without having to depend on the experience and the skill of the engineer.

The sequence of operations explained with reference to FIG. 6 is only exemplary, and the first embodiment is not limited by that sequence of operations. For example, the sequence of operations illustrated in FIG. 7 can be arbitrarily changed without causing any contradictions in the operation details. For example, in the operation performed at Step S205, if the attachment position of the topical RF coil 5 is also displayed, then the operations from Step S207 to Step S209 need not be performed.

Third Modification Example of First Embodiment

The output control function 16c can report information notifying that the test subject S is positioned at the placement position.

For example, the output control function 16c determines whether or not the test subject S is positioned at the placement position. The determination about whether or not the test subject S is positioned at the placement position is performed automatically via image recognition with respect to the camera image I10. For example, the output control function 16c compares the current position of the test subject S as recognized from the camera image I10 with the placement position corresponding to the statistical information. If the distance between the current position of the test subject S and the placement position corresponding to the statistical information is within a predetermined range (smaller than a threshold value), then the output control function 16c determines that the test subject S is positioned at the placement position. If it is determined that the test subject S is positioned at the placement position, the output control function 16c displays a message such as "The test subject is positioned at the preferred placement position" in the mount monitor 8b.

However, regarding the information indicating that the test subject S is positioned at the placement position, the output form is not necessarily limited to a message. Alternatively, for example, the output control function 16c can change the color of the camera image I10 or the color of the frame border of the profile position image 130, or can hide the profile position image 130, so as to report information notifying that the test subject S is positioned at the placement position.

Moreover, regarding the information indicating that the test subject S is positioned at the placement position, the output form need not be one of different display forms. For example, the output control function 16c can voice-output a message such as "test subject is positioned at the preferred placement position", or can notify the same using sound effects or vibrations.

Fourth Modification Example of First Embodiment

The placement position of the test subject S, which is explained in the second modification example of the first embodiment, can be hidden as may be necessary. For example, after the test subject S is positioned at the placement position or when an instruction is received from the operator, the output control function 16c can hide the placement position.

For example, the output control function 16c determines whether or not the test subject S is positioned at the placement position. The determination about whether or not the test subject S is positioned at the placement position is performed in an identical manner to the operation according to the third modification example explained above. Hence, that explanation is not given again. If it is determined that the test subject S is positioned at the placement position, then the output control function 16c hides the profile position image 130.

Meanwhile, the determination about whether or not the test subject S is positioned at the placement position is not limited to image recognition. Alternatively, the determination can be manually performed by the engineer. For example, when it is determined that the test subject S has lied down at the placement position, the engineer performs an input (such as presses a button) indicating the finalization of the position of the test subject. When that input is performed, the output control function 16c hides the display of the placement position.

Fifth Modification Example of First Embodiment

In the first embodiment described above, the explanation is given for the case in which a single topical RF coil 5 is attached to the test subject S. However, the first embodiment is not limited by that case. For example, in the parallel imaging that represents one of the high-speed imaging methods, the MRI scanning is performed by combining a body coil placed on the abdomen of the test subject S and a spine coil placed on the back of the test subject S. In such a case in which a plurality of topical RF coils 5 is attached to the test subject S, the MRI device 100 can output a plurality of attachment positions based on the relative positions of the topical RF coils 5.

For example, when a plurality of topical RF coils 5 is attached to the test subject S, the selection function 16b selects the statistical information containing the relative positions of the topical RF coils 5. In that case, in the statistical information table, the relative positions of the topical RF coils 5 are stored for each set of statistical information. The relative positions are defined according to the distances and the directions of the center positions (coordinates) of the topical RF coils 5.

Then, the selection function 16b selects the statistical information containing the relative positions of the topical RF coils 5. For example, the selection function 16b selects, from among a plurality of sets of statistical information stored in the statistical information table, the statistical information corresponding to the information obtained by the obtaining function 16a. Herein, when a plurality of topical RF coils 5 is attached to the test subject S, the selected statistical information contains the relative positions of the topical RF coils 5.

Subsequently, based on the relative positions of a plurality of topical RF coils 5, the output control function 16c outputs a plurality of attachment positions for attaching the topical RF coils 5 to the test subject S.

Figure 8:
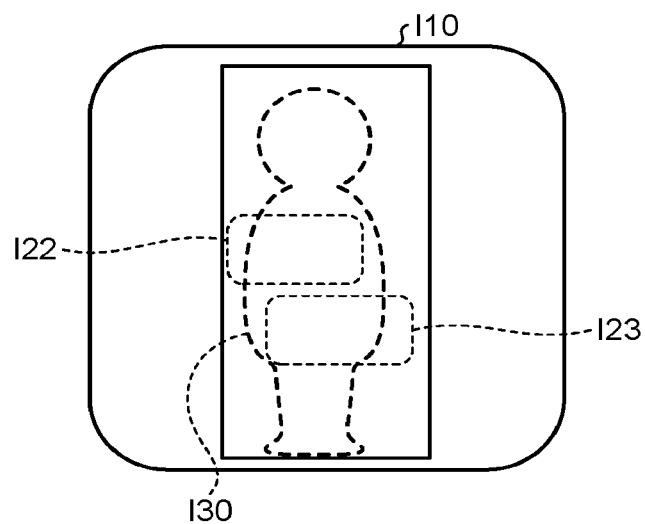
FIG. 8 is a diagram illustrating an example of the display performed by the output control function according to a fifth modification example of the first embodiment.

FIG. 8 is a diagram illustrating an example of the display performed by the output control function 16c according to the fifth modification example of the first embodiment. In FIG. 8, for explanatory convenience, the image of the test subject S as captured in the camera image I10 is not illustrated.

As illustrated in FIG. 8, the output control function 16c displays, in an overlapping manner in the real-time camera image I10, profile position images 122 and 123. The profile position images 122 and 123 represent indicators of the attachment positions of two different topical RF coils 5. The positional relationship between the profile position images 122 and 123 is defined based on the relative positions of the topical RF coils 5.

In this way, when a plurality of topical RF coils 5 is attached to the test subject S, the MRI device 100 can output a plurality of attachment positions based on the relative positions of the topical RF coils 5.

Second Embodiment

In a second embodiment, the explanation is given for the case in which a projector is used as the output form for the output control function 16c.

Figure 9:
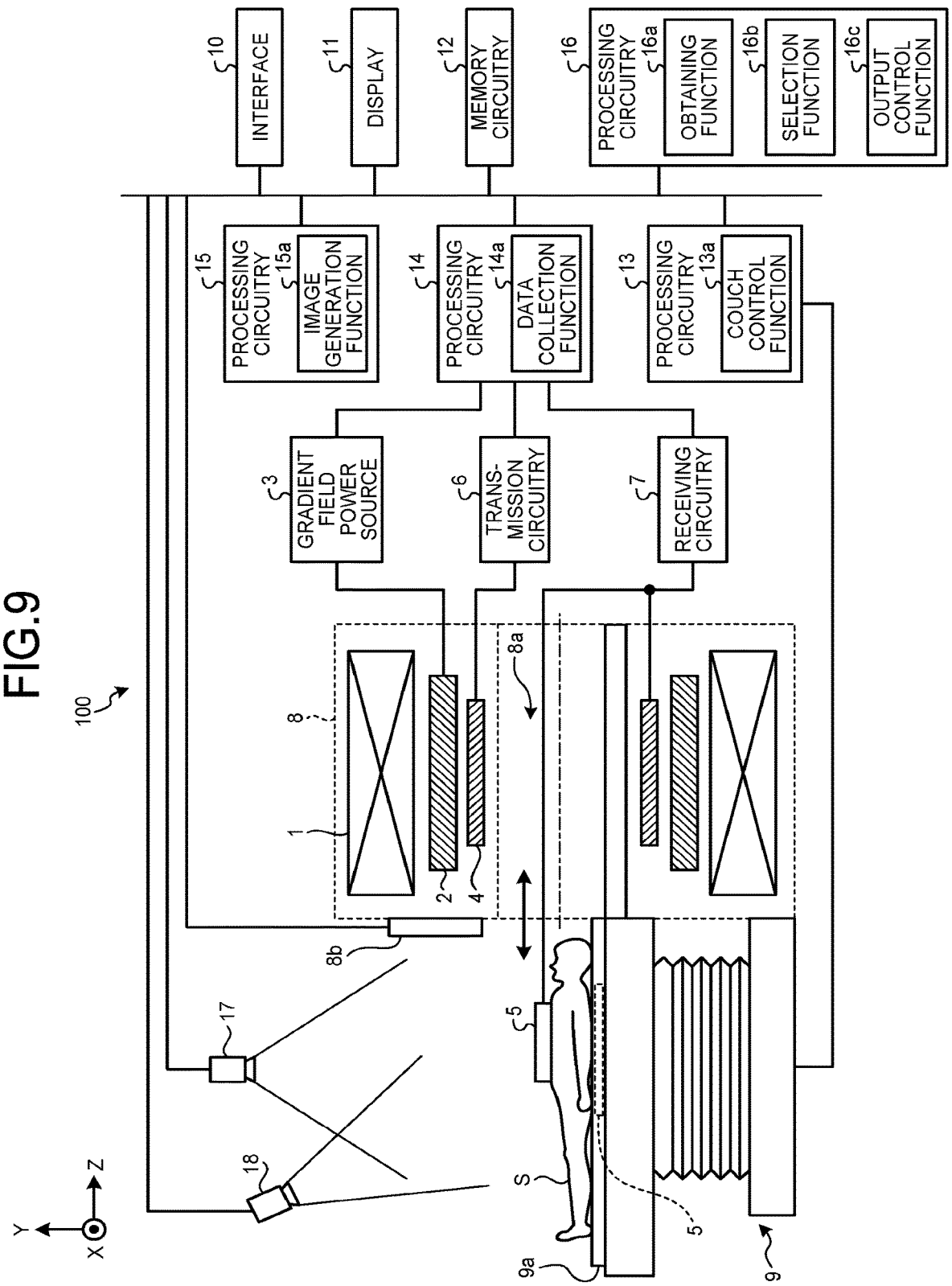
FIG. 9 is a diagram illustrating an exemplary configuration of the MRI device according to a second embodiment.

FIG. 9 is a diagram illustrating an exemplary configuration of the MRI device 100 according to the second embodiment. The MRI device 100 according to the second embodiment has an identical configuration to the MRI device 100 illustrated in FIG. 1, except for the fact that a projector 18 is additionally included and some of the operations of the output control function 16c are different. Thus, in the second embodiment, the explanation is given mainly about the differences with the first embodiment. Regarding the identical configuration to the first embodiment, the reference numerals illustrated in FIG. 1 are used without modification, and the same explanation is not given again.

The projector 18 is a device for outputting (projecting) a video onto the couchtop 9a of the couch 9 under the control of the output control function 16c. The projector 18 is disposed at a position from which a video can be projected onto the couchtop 9a of the couch 9, such as at the ceiling or on a wall of the photographing room, or on the mount 8.

The output control function 16c outputs (projects) at least either the attachment position of the topical RF coil 5 or the placement position of the test subject S onto the couchtop 9a of the couch 9 on which the test subject is positioned.

Figure 10:
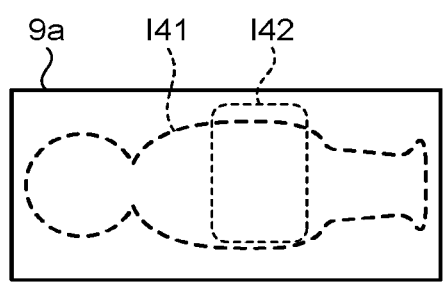
FIG. 10 is a diagram illustrating an example of the display performed by the output control function according to the second embodiment.

FIG. 10 is a diagram illustrating an example of the display performed by the output control function 16c according to the second embodiment. In FIG. 10 is illustrated an example in which the coil attachment position and the test subject position corresponding to the statistical information is projected onto the couchtop 9a.

In the example illustrated in FIG. 10, the output control function 16c projects profile position images 141 and 142 onto the couchtop 9a. The profile position image 141 represents an indicator of the frame border indicating the profile position of a person present at the average test subject position. The profile position image 142 represents an indicator of the frame border indicating the average coil attachment position. The profile position images 141 and 142 can be displayed by performing operations identical to the operations explained in the first embodiment. Hence, that explanation is not given again.

In this way, the output control function 16c can implement projection mapping and project the attachment position of the topical RF coil 5 and the placement position of the test subject S.

Meanwhile, the display example illustrated in FIG. 10 is only exemplary, and the second embodiment is not limited by that example. Alternatively, for example, the output control function 16c can project only either one of the profile position images 141 and 142.

When the test subject S is positioned on the couchtop 9a, the output control function 16c projects a video onto the couchtop 9a on which the test subject S is positioned. In that case, the video projected from the projector 18 gets projected onto the couchtop 9a or the body surface of the test subject S.

Meanwhile, the operations explained in the second embodiment can be appropriately combined with the operations explained in the first embodiment or the modification examples thereof.

Third Embodiment

In a third embodiment, the explanation is given for the case in which the statistical information is generated from a camera image.

Figure 11:
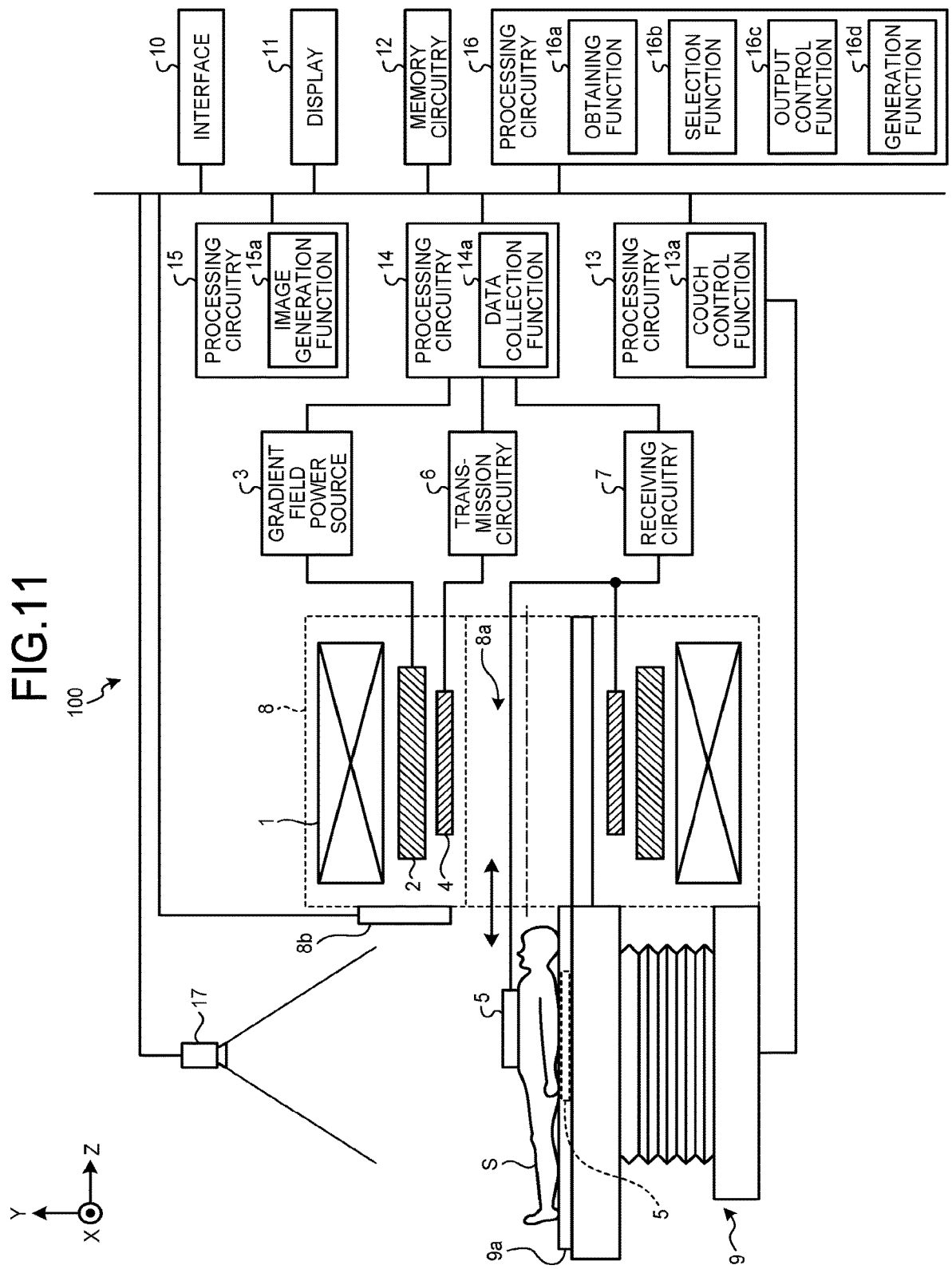
FIG. 11 is a diagram illustrating an exemplary configuration of the MRI device according to a third embodiment.

FIG. 11 is a diagram illustrating an exemplary configuration of the MRI device according to the third embodiment. The MRI device 100 according to the third embodiment has an identical configuration to the MRI device 100 illustrated in FIG. 1, except for the fact that the processing circuitry 16 additionally includes a generation function 16d. Thus, in the third embodiment, the explanation is given mainly about the differences with the first embodiment. Regarding the identical configuration to the first embodiment, the reference numerals illustrated in FIG. 1 are used without modification, and the same explanation is not given again.

The generation function 16d generates statistical information based on the camera image I10. For example, the generation function 16d generates statistical information either based on the camera image I10 taken immediately before the insertion of the couchtop 9a, on which the test subject S is lying down, into the bore 8a; or based on the camera image I10 taken when the couchtop 9a, on which the test subject S is lying down, is released from the bore 8a after the scanning. The camera images I10 taken at such timings are believed to reflect the test subject position and the coil attachment position during the actual scanning.

More particularly, the generation function 16d calculates the center positions of the test subject S and the topical RF coil 5 captured in the camera image I10. Then, based on the center positions of the test subject S and the topical RF coil 5, the generation function 16d updates the statistical information table stored in the memory circuitry 12.

For example, the explanation is given for the case in which, in the coil setting performed immediately before the target camera image I10 for processing is photographed, the obtaining function 16a obtains the following information: the height indicating "156 cm", the posture indicating "supine", the region to be scanning indicating "abdomen", and the coil type indicating "coil for abdomen". In that case, the generation function 16d refers to the statistical information table illustrated in FIG. 4, and searches for the statistical information corresponding to the information obtained by the obtaining function 16a. Then, from the statistical information table illustrated in FIG. 4, the selection function 16b selects the statistical information identified by the statistical ID "001". Subsequently, based on the center positions of the test subject S and the topical RF coil 5 as calculated from the camera image I10, the generation function 16d updates the statistical information identified by the statistical ID "001".

For example, in the statistical information, the coil attachment positions (coordinates) during a few number of times of scanning performed before taking the average of the coil attachment positions are held in a corresponding manner. Hence, the generation function 16d calculates the average value using the coil attachment positions during a few number of times of scanning in the past as well as using the coil attachment position calculated in the current instance. Then, using the newly-calculated average value of the coil attachment positions, the generation function 16d updates the statistical information identified by the statistical ID "001". Meanwhile, the operation for calculating the average value of the test subject positions is identical to the operation for calculating the average value of the coil attachment positions. Hence, that explanation is not given again.

In this way, the generation function 16d updates the statistical information based on the camera image I10. Thus, the MRI device 100 can update the statistical information table based on the latest instance of scanning.

Meanwhile, the explanation about the generation function 16d as given above is only exemplary, and the third embodiment is not limited by that explanation. For example, regarding the camera image I10 to be processed by the generation function 16d, instead of automatically obtaining the camera image I10 at the timing explained above, the camera image I10 can be specified via a manual operation performed by the user.

Moreover, in the example explained above, only the statistical information table stored in the MRI device 100 (the memory circuitry 12) is updated. However, the third embodiment is not limited by that example. For example, the statistical information table can be shared among the MRI devices having the same model as the MRI device 100, and the shared statistical information table can be updated. Herein, although the shared statistical information table can be stored in the memory circuitry 12, it is preferable to store it in an external memory device such as a PACS.

Moreover, the sharing of the statistical information table is not limited among the MRI devices having of the same model. Alternatively, for example, the statistical information table can be shared among arbitrary devices such as the MRI devices of the same class (for example, 1.5 tesla) or the MRI devices manufactured by the same manufacturer; and the shared statistical information table can be updated too.

Meanwhile, the generation function 16d need not always be included in the MRI device 100. For example, the generation function 16d can be included in an arbitrary external device connected to the MRI device 100. Then, the camera image I10 can be obtained from the MRI device 100, and the statistical information table can be updated accordingly.

Other Embodiments

Apart from the embodiments described above, it is possible to implement various other embodiments.
Other Type of Medical Image Diagnostic Device For example, in the embodiments and the modification examples described above, the explanation is given for the case in which the processing functions according to the embodiments are implemented in the MRI device 100. However, the embodiments are not limited by that case. For example, other than implementing them in the MRI devices, the processing functions can be widely implemented in medical image diagnostic devices such as an X-ray CT device (CT stands for Computed Tomography) in which imaging is performed when the test subject S is positioned on the couch.

Meanwhile, for example, the constituent elements of the device illustrated in the drawings are merely conceptual, and need not be physically configured as illustrated. The constituent elements, as a whole or in part, can be separated or integrated either functionally or physically based on various types of loads or use conditions. Moreover, the processing functions implemented in the device are entirely or partially realized by a CPU or by computer programs that are analyzed and executed by a CPU, or are realized as hardware by wired logic.

Of the processes described in the embodiments and the modification examples, all or part of the processes explained as being performed automatically can be performed manually. Similarly, all or part of the processes explained as being performed manually can be performed automatically by a known method. The processing procedures, the control procedures, specific names, various data, and information including parameters described in the present written description or illustrated in the drawings can be changed as required unless otherwise specified.

The attachment position output method explained in the embodiments and the modification examples can be implemented when an attachment position output program that is prepared in advance is executed in a computer such as a personal computer or a workstation. The attachment position output program can be distributed via a network such as the Internet. Alternatively, the attachment position output program can be recorded in a computer-readable and non-transitory recording medium such as a hard disk, a flexible disk (FD), a compact disk read only memory (CD-ROM), a magneto-optical disk (MO, or a digital versatile disk (DVD); and a computer can read the attachment position output program from a recording medium and execute it.

In the embodiments and the modification examples described above, the term "real time" implies that, every time the data to be processed is generated, the operations are performed instantly. For example, the operation of displaying an image in real time is not limited to the case in which the timing of taking an image of the test subject exactly matches with the timing of displaying the image, and represents a concept that also includes the case in which the image is displayed with a slight delay attributed to various operations such as image processing.

According to at least one of the embodiments described above, it becomes possible to enhance the reproducibility of imaging.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging device, comprising:
   memory circuitry that stores a plurality of sets of statistical information that are classified according to at least one of a body type of a first test subject, a posture of the first test subject, a position of the first test subject, an attachment position of a first radio frequency (RF) coil attached to the first test subject, a type of the first RF coil, identification information of the first RF coil, or a region to be scanned; and
   processing circuitry configured to
      obtain, from an image of a second test subject taken by an optical photographing device, at least one of: (1) first information indicating at least one of a body type of the second test subject, a posture of the second test subject, or a position of the second test subject; or (2) second information indicating at least one of an attachment position of a second RF coil attached to the second test subject, a type of the second RF coil, identification information of the second RF coil, or a region to be scanned,
      select, from the memory circuitry in response to the obtaining of the first information, statistical information corresponding to the first information,
      select, from the memory circuitry in response to the obtaining of the second information, statistical information corresponding to the second information, and
      output an image indicating how to attach the second RF coil to the second test subject, based on selected statistical information.

2. The magnetic resonance imaging device according to claim 1, wherein the processing circuitry is further configured to:
   obtain a scanning condition to be applied at a time of scanning the second test subject, and
   select the statistical information based on the obtained scanning condition.

3. The magnetic resonance imaging device according to claim 2, wherein the processing circuitry is further configured to:
   obtain, as the second scanning condition, information indicating at least either a region to be scanned, or a type of the second RF coil, or identification information of the second RF coil, and
   select, as the statistical information, statistical information corresponding to information indicating at least either the region to be scanned, or the type of the second RF coil, or the identification information of the second RF coil.

4. The magnetic resonance imaging device according to claim 1, wherein the processing circuitry is further configured to cause a display to display the attachment position of the second RF coil corresponding to the statistical information.

5. The magnetic resonance imaging device according to claim 4, wherein the processing circuitry is further configured to cause the display to display the attachment position of the second RF coil corresponding to the statistical information in an overlapping manner in an image of the test subject or in a model image of a human body.

6. The magnetic resonance imaging device according to claim 1, wherein the processing circuitry is further configured to notify information indicating that the second RF coil has been attached at the attachment position.

7. The magnetic resonance imaging device according to claim 1, wherein the processing circuitry is further configured to
select, based on the image-related information, statistical information of placement position of the test subject, and
output the placement position along with the attachment position of the second RF coil.

8. The magnetic resonance imaging device according to claim 7, wherein the processing circuitry is further configured to notify information indicating that test subject is positioned at the placement position.

9. The magnetic resonance imaging device according to claim 7, wherein, when test subject is positioned at the placement position or when an instruction is received from an operator, the processing circuitry is further configured to not display the placement position.

10. The magnetic resonance imaging device according to claim 1, wherein the processing circuitry is further configured to
select, when a plurality of RF coils is to be attached to the test subject, statistical information that contains relative positions of the plurality of RF coils, and
output, based on the relative positions, a plurality of attachment positions meant for attaching the plurality of RF coils to the test subject.

11. The magnetic resonance imaging device according to claim 1, wherein the processing circuitry is further configured to output, to a couchtop of a couch on which the test subject is positioned, at least either the attachment position of the second RF coil or a placement position of the test subject.

12. The magnetic resonance imaging device according to claim 1, wherein the processing circuitry is further configured to generate the statistical information further based on the obtained image.

13. The magnetic resonance imaging device according to claim 12, wherein the processing circuitry is further configured to generate the statistical information based on a first image taken immediately before inserting a couchtop, on which the test subject is lying down, into a bore, or based on a second image taken when the couchtop, on which the test subject is lying down, is released from the bore after scanning is performed.

14. An attachment position output method, comprising:
obtaining, by processing circuitry from an image of a second test subject taken by an optical photographing device, at least one of: (1) first information indicating at least one of a body type of the second test subject, posture of the second test subject, or a position of the second test subject; or (2) second information indicating at least one of an attachment position of a second radio frequency (RF) coil attached to the second test subject, a type of the second RE coil, identification information of the second RF coil, or a region to be scanned;
selecting, from memory circuitry, in response to the obtaining of the first information, a plurality of sets of statistical information corresponding to the first information that are stored in the memory circuitry and classified according to at least one of: a body type of a first test subject, a posture of the first test subject, a position of the first test subject, an attachment position of a first RF coil attached to the first test subject, a type of the first RF coil, identification information of the first RF coil, or a region to be scanned;
selecting, from the memory circuitry in response to the obtaining of the second information, statistical information corresponding to the second information; and
outputting an image indicating how to attach the second RF coil to the second test subject, based on the selected statistical information.

15. A non-transitory computer-readable storage medium storing therein a program configured to cause a computer to execute a method comprising:
obtaining, from an image of a second test subject taken by an optical photographing device, at least one of: (1) first information indicating at least one of a body type of the second test subject, posture of the second test subject, or a position of the second test subject; or (2) second information indicating at least one of an attachment position of a second radio frequency (RF) coil attached to the second test subject, a type of the second RF coil, identification information of the second RF coil, or a region to be scanned;
selecting, from memory circuitry, in response to the obtaining of the first information, a plurality of sets of statistical information corresponding to the first information that are stored in the memory circuitry and classified according to at least one of: a body type of a first test subject, a posture of the first test subject, a position of the first test subject, an attachment position of a first RF coil attached to the first test subject, a type of the first RF coil, identification information of the first RF coil, or a region to be scanned;
selecting, from the memory circuitry in response to the obtaining of the second information, statistical information corresponding to the second information; and
outputting an image indicating how to attach the second RF coil to the second test subject based on the selected statistical information.

* * * * *